(12) United States Patent
Chu et al.

(10) Patent No.: US 7,616,000 B2
(45) Date of Patent: Nov. 10, 2009

(54) ULTRA LOW OUTPUT IMPEDANCE RF POWER AMPLIFIER FOR PARALLEL EXCITATION

(75) Inventors: Xu Chu, Shanghai (CN); Yunfeng Liu, Shanghai (CN); Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/940,490

(22) Filed: Nov. 15, 2007

(65) Prior Publication Data

US 2009/0128154 A1 May 21, 2009

(51) Int. Cl.
*G01V 3/00* (2006.01)
(52) U.S. Cl. ........................ 324/322; 324/318
(58) Field of Classification Search ................ 324/322, 324/318
See application file for complete search history.

(56) References Cited

U.S. PATENT DOCUMENTS

| 4,825,162 | A | | 4/1989 | Roemer et al. |
| 5,420,537 | A | * | 5/1995 | Weedon et al. ............. 330/251 |
| 6,031,422 | A | * | 2/2000 | Ideler ........................ 330/10 |
| 6,411,090 | B1 | * | 6/2002 | Boskamp .................... 324/318 |
| 6,646,439 | B1 | * | 11/2003 | Bunk ........................ 324/322 |
| 6,727,703 | B2 | | 4/2004 | Lee |
| 6,982,554 | B2 | | 1/2006 | Kurpad et al. |
| 7,075,301 | B2 | | 7/2006 | Zhu |

* cited by examiner

*Primary Examiner*—Louis M Arana
(74) *Attorney, Agent, or Firm*—Scott J. Asmus

(57) ABSTRACT

An ultra low output impedance RF power amplifier for driving a multiple transmit coil Magnetic Resonance Imaging (MRI) system is described, comprising an output matching network with high power MOSFET operatively coupled to at least one transmit coil in the MRI system for a desired output power and impedance. This invention also describes a method for achieving decoupling using the RF power amplifier to drive at least one transmit coil.

13 Claims, 4 Drawing Sheets

US 7,616,000 B2

ULTRA LOW OUTPUT IMPEDANCE RF POWER AMPLIFIER FOR PARALLEL EXCITATION

BACKGROUND

The present invention relates to magnetic resonance systems, and more particularly to RF power amplifiers for parallel excitation in magnetic resonance systems.

There has been very active development in the field of magnetic resonance (MR) where parallel RF transmission with multiple transmit elements is used to benefit various applications by improving spin excitation. In high field MR, inhomogeneity in the RF magnetic field caused by wave propagation and dielectric effect in particular, may be reduced by optimizing the amplitude and phase of the driving currents when conducting multi-port excitation on birdcage coils or transmit arrays consisting of individual coil elements. It is possible to further reduce the RF magnetic field in homogeneity effect by independently controlling the RF waveforms of individual transmit channels and leveraging the capacity of full fledged parallel RF transmission in accelerating multidimensional excitation and managing power deposition.

Recent developments have provided support for direct validation of full-fledged parallel RF transmission principles. However, the development of efficient parallel transmit coil arrays remains a significant challenge. Coupling between the transmit coil elements is one of the key challenges to transmit coil array construction and use. Many approaches have been proposed to address the issue of inter coil coupling. One of the approaches defines, for parallel RF reception, a preamplifier decoupling scheme. This scheme reduces the input impedance of a preamplifier to nearly zero, thereby maximizing the input impedance seen by the corresponding receive coil at its output port and causing blockage of coupled current in the coil. However, for parallel transmit, practicing an analogous scheme is ineffective due to the typical RF amplifiers' 50Ω impedance seen by the coils.

Many decoupling methods have been proposed to address the inter-coil coupling problem. One category of methods introduces partial geometric overlap of coils to annul the mutual inductance between them. Such methods are effective for nearest neighbor elements only, and tend to impose stringent constraints on the geometry and placement of the individual coils. Another category of methods employs a capacitive or inductive decoupling bridge or a multi-port network, at the cost of increased RF loss and increased complexity of the decoupling circuits and tuning efforts. A third category of methods suppresses the coupling-induced currents with high source impedance, by, for example, integrating RF power MOSFET's with the rungs of a TEM coil or driving nonresonant loop-shaped coils directly. In these examples, a MOSFET is configured to function approximately as a current source, and thus to yield high impedance at the driving ports. However, the series resonant element in this method also acts as a severely mismatched load to the MOSFET, which may significantly degrades its maximum available output power. A fourth category of methods applies active decoupling. Such methods calibrate coupling between element coils first and then introduce proper correlations, realized either by analog circuits or a digital vector modulation array, between the driving voltages of each element to cancel the coupling components in the currents.

Therefore, there is a need for a system and method for development of a decoupling method that supports parallel transmit applications and facilitates transmit performance optimization by eliminating constraints on array geometry.

BRIEF DESCRIPTION

Multiple transmit chains are employed in parallel RF transmission for setting up the currents in an array of transmit coils in a coordinated way. The currents in turn induce transmit magnetic field in the subject. However the current in each of the element coils is typically subject to corruption due to inter-coil coupling. The coupling-induced corruptive components are much influenced by the source impedance seen by the element coils. To overcome the disadvantages as above, embodiments of the invention improve the inter-element isolation of transmit array with the aid of matching networks on the RF power amplifiers and/or the element coils.

In a first aspect, a Radio Frequency (RF) power amplifier for driving a multiple RF transmit coil Magnetic Resonance Imaging (MRI) system is provided. The RF amplifier includes an output matching network with high power MOSFET operatively coupled to at least one transmit coil in the MRI system for a desired output power and impedance.

In another aspect, an ultra-low output impedance Radio Frequency (RF) power amplifier for transmit coil decoupling in parallel excitation is provided. The ultra-low output impedance Radio Frequency (RF) amplifier includes an output matching network and a high power MOSFET operatively coupled to the input of the output matching network to provide desired impedance for the transmit coil decoupling and to maximize available power.

In yet another aspect, a method for achieving decoupling using radio-frequency (RF) power amplifier to drive at least one transmit coil is provided. The method includes, transforming a drain source resistive component of a MOSFET to a desired output impedance using an output matching network, transforming an input impedance of at least one transmit coil to a load impedance, and matching of the load impedance to an optimum load of the MOSFET for a desired output power.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
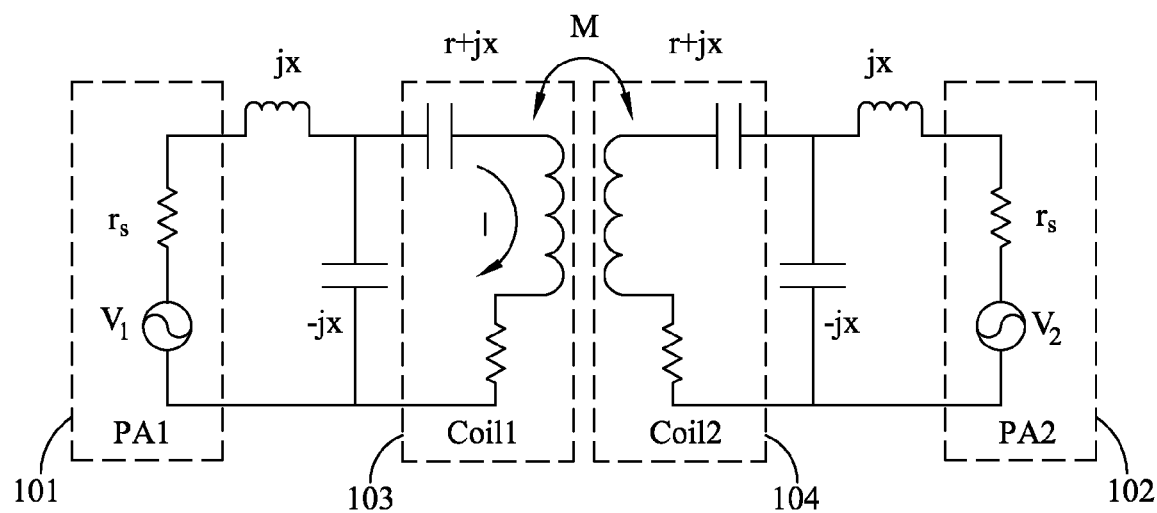
FIG. 1 is an equivalent circuit model of coupled transmit coils driven by two independent RF power amplifiers.

Referring to FIG. 1, it shows an equivalent circuit model of two identical coils 103, 104 driven by two independent RF power amplifiers 101, 102. Each power amplifier is modeled as a voltage source with a source resistance $r_s$. The impedance of each coil without matching components is $r+jx$, and the inductive coupling between these two coils is captured by mutual inductance M. Representing a common configuration, the L-shaped matching network on each coil, which consists of a capacitor and an inductor, not only transforms the low impedance of the series resonant coil into a desired value (normally 50Ω), but also amplifies the input current by x/r times. When both coils 103, 104 are driven by their corresponding amplifiers 101, 102, the current I running in coil 103 consists of two components, the desired one $I^{(S)}$ that is due to the controlling voltage $V_1$ and the undesired (corruptive) one $I^{(M)}$ that is due to $V_2$:

$$\begin{cases} I^{(S)} = \dfrac{-jxV_1}{rr_S + \omega^2 M^2 r_S^2 / (rr_S + x^2) + x^2} \\ I^{(M)} = \dfrac{-jxV_2}{rr_S + \omega^2 M^2 r_S^2 / (rr_S + x^2) + x^2} \cdot \dfrac{j\omega M}{r + x^2 / r_s} \end{cases} \quad [1]$$

where ω is the Larmor frequency. The severity of current corruption caused by the coupling effect could be represented by the ratio of $I^{(M)}$ to $I^{(S)}$:

$$\frac{|I^{(M)}|}{|I^{(S)}|} = \frac{\omega M}{r + x^2 / r_s} \frac{|V_2|}{|V_1|}. \quad [2]$$

For given r, x, M and ω, the minimum of the ratio is achieved by minimizing $r_s$, which suggests that minimizing source impedance will improve isolation.

Figure 2:
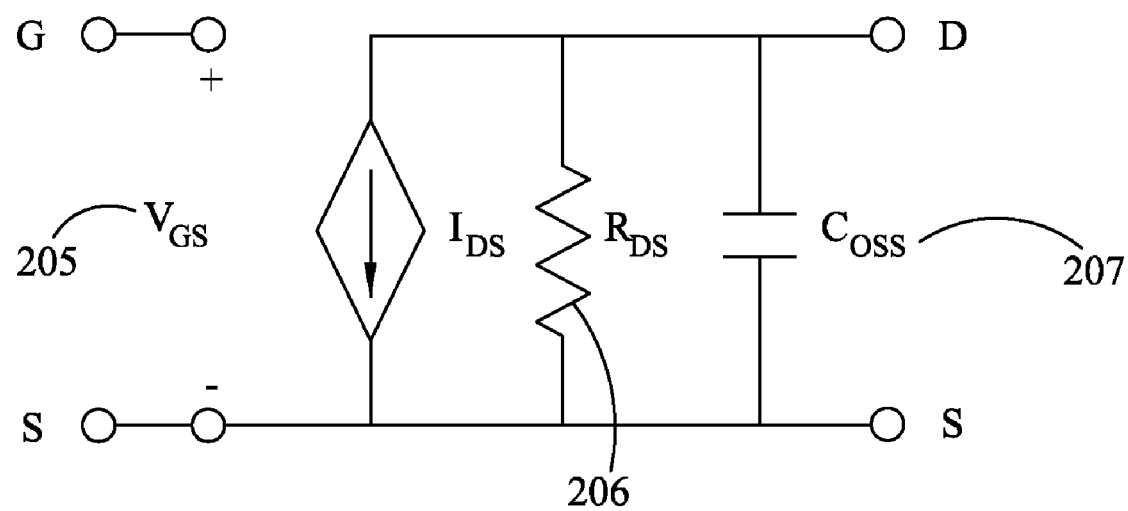
FIG. 2 illustrates the equivalent circuit model of MOSFET.

In practical solid-state RF power amplifiers, metallic oxide semiconductor field effect transistors (MOSFET) are commonly used to drive the RF power to a desired level. When it operates in the saturation region of its DC characteristic, a MOSFET behaves approximately as a voltage-controlled current source. FIG. 2 illustrates the equivalent circuit model in this case, in which the drain-source resistance $R_{DS}$ 206 is typically of a very high value. When a MOSFET operates in a linear mode (Class A or AB) with a fixed DC drain-source voltage 205, its maximum output power without distortion critically depends on its load impedance. The maximum rated power can only be achieved when the load impedance equals an optimum value, which is normally provided by the manufacturer.

Figure 3:
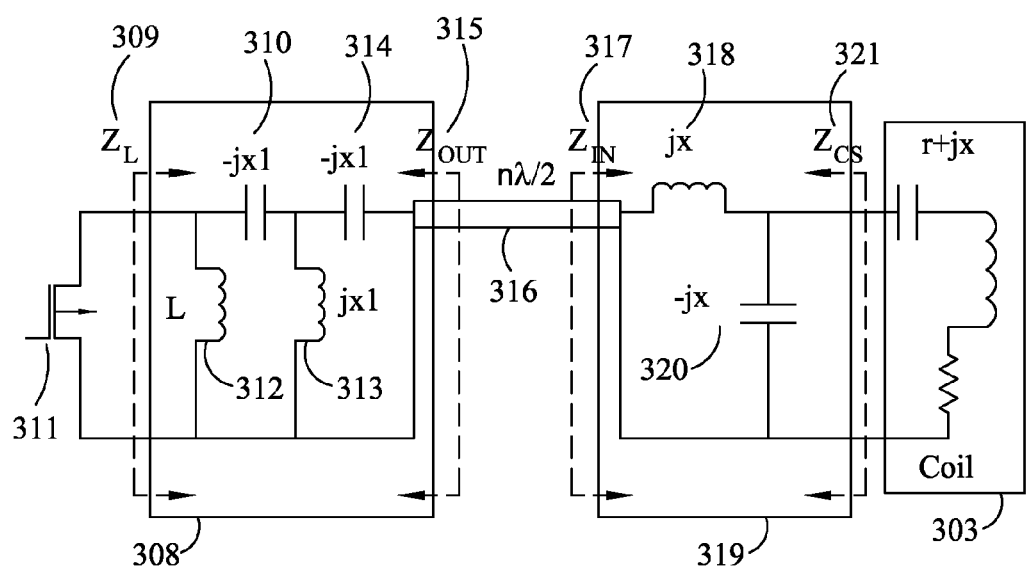
FIG. 3 illustrates an output-matching network in the ultra-low output impedance RF power amplifier in one embodiment of the present invention.

To maximize inter-coil or inter-element isolation by taking advantage the low source-impedance idea above and to simultaneously maximize the available output power, a new amplifier output stage design has been developed. As used herein the terms coils and elements are used interchangeably and refer to the transmit array coils in the imaging system. Referring to FIG. 2 and FIG. 3, an output-matching network 308 for MOSFET 311 is introduced. In an embodiment of the invention, the matching network applies an inductor L 312 in parallel to the output of MOSFET 311 to resonate its drain-source capacitance $C_{OSS}$ 207. Then a T-shaped network consisting of two capacitors C 310, 314 and an inductor L 313, which are chosen to be series resonant at the working frequency, further transforming the drain-source resistance $R_{DS}$ 206 into $$Z_{OUT} = \frac{1}{\omega^2 C^2 R_{DS}}. \quad [3]$$

The $R_{DS}$ can be evaluated by measuring the differential of the drain source voltage $V_{DS}$ to the current $I_{DS}$ in the saturation region of the MOSFET's DC characteristics, with the gate voltage fixed to a value that could bias the $I_{DS}$ to a given value at a given $V_{DS}$. Because of the high resistance presented by $R_{DS}$ 206, the output impedance $Z_{OUT}$ 315 can thus be made very low as it is primarily determined by the series resonant circuit, which is nearly a short circuit at the resonant frequency. As analogous to the receive case, when $Z_{OUT}$ 315 is close to zero, the input-matching network 319 at the coil side 303 acts as a parallel resonant circuit and the corruptive current component due to inter-coil coupling sees a large impedance and will thus be substantially suppressed. In one embodiment, the output impedance is about 10 ohms or less. In a further embodiment, the output impedance is about 5 ohms or less. In the meanwhile, the same output-matching network 308 for the MOSFET 311 transforms the input impedance of the coil, normally matched to 50Ω, into the load impedance 309

$$Z_L = \frac{1}{50\omega^2 C^2 - \dfrac{j}{\omega L_1}}. \quad [4]$$

Generally, the optimum load can be expressed as $$Z_{OL} = \frac{1}{\dfrac{1}{R_{OL}} - j\omega C_{OSS}}, \quad [5]$$

in which $R_{OL}$ represents the load resistance that enables the MOSFET to output highest power. By setting L 313 and C 310, 314 to satisfy $$R_{OL} = \frac{1}{50\omega^2 C^2} = 50\omega^2 L^2, \quad [6]$$

and resonating $C_{OSS}$ 207 with L 312, the load impedance $Z_L$ 309 is matched to the optimum value specified for the MOSFET 311, and thus ensures that highest output power can be achieved. In a non-limiting example, the output power is at least about 500 W. This design allows flexible placement of the RF power amplifier's power stage. For off-coil placement, a coaxial cable with nλ/2 length 316 may be used to connect a coil 303 with its corresponding amplifier that is some distance away. Because of the current amplification effect at the matching network on each coil, the current in the cable can be much lower than that in the coil, which facilitates management of cable loss.

Figure 4:
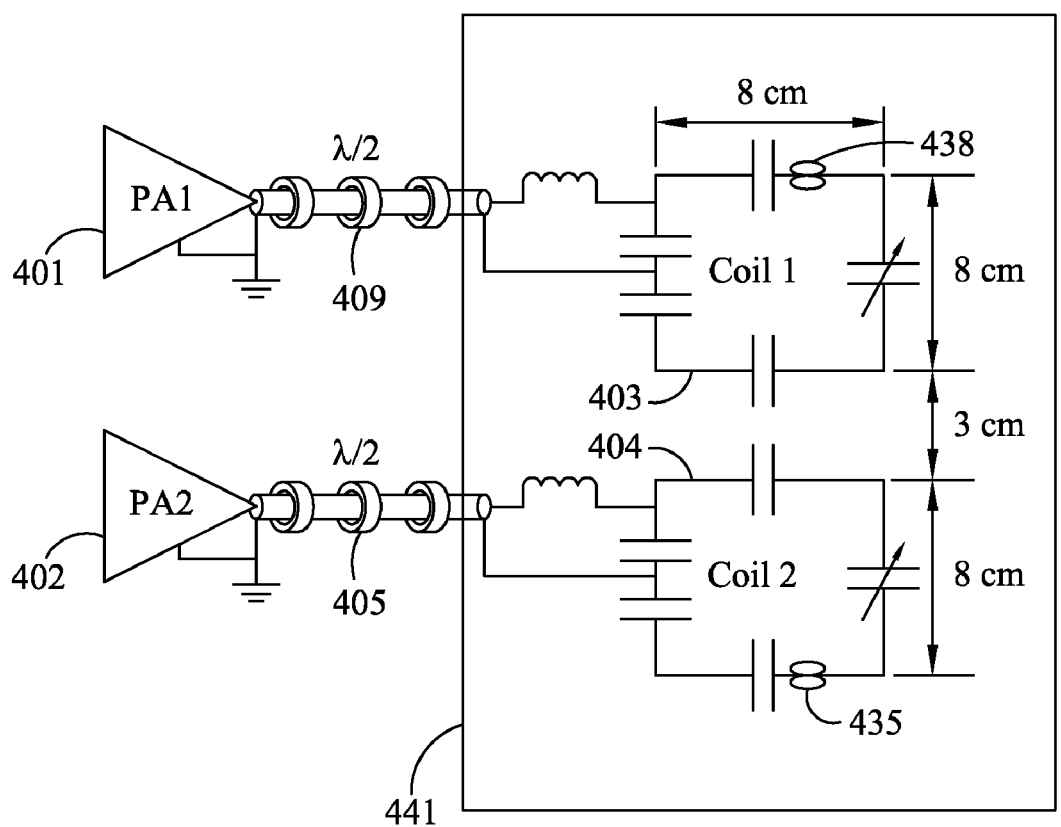
FIG. 4 shows an embodiment of the transmit coils driven independently by two ultra low output impedance RF power amplifiers of the present invention.

Referring to FIG. 4, an exemplary embodiment of the transmit coils driven independently by two ultra low output impedance RF power amplifiers of the present invention is shown. With this example, the choice of components and the tuning of the matching networks are illustrated. Two ultra-low output impedance RF power amplifiers 401, 402 are developed to work at 128 MHz. Each amplifier consisting of three amplification stages, and the final stage is built with a high power MOSFET based on the scheme shown in FIG. 3. Based on power efficiency and linearity considerations, the device is set to operate in Class AB and the bias current is set to 200 mA. The bias voltage is applied in pulse mode, as triggered by an external gating signal. The drain voltage is set to 150V and the $R_{OL}$ of the MOSFET at this voltage is about 25Ω. According to Eqs. 6, C 310, 314 is selected to be 35 pF and L 313 is adjusted to resonate with it at 128 MHz.

A phased array consisting of two 8×8 cm² surface coils 403, 404 is employed to evaluate the decoupling performance of the two amplifiers 401, 402. The array is placed on a saline phantom 441 (1.33 g/L NaCl, 0.66 g/L CuSO4) that is with a 30 cm length, 20 cm width and 20 cm height. The separation between coils 403, 404 and the distance from each of them to phantom 441 is adjustable. Initially coils 403, 404 are placed 1 cm above the phantom 441 with a 3 cm inter-element separation. Half wavelength cables are used to connect the prototype amplifiers 401, 402 to element coils 403, 404 respectively. For the bench tests in this embodiment, three ferrite rings 409, 405 associated with each cable are used to block the common mode current.

The current running in the elements 403, 404 are respectively monitored through two sensing coils 435, 438. The sensing coil 438 for 403 employed a butterfly structure, which has two 1 cm diameter loop placed across the conductor that is farthest away from coil 435. With this configuration the electromotive forces (EMF) induced in the two loops of the sensing coil 438 by the current of element 403 are in-phase and thus enhanced, while those by the current of element 404 are approximately anti-phase and thus neutralized. Consequently, compared to element 403, the contribution of element 404 to sensing coil 438 is reduced to a negligible level in this embodiment of the invention. Similarly, another sensing coil 435 is constructed to detect the current in element 404 only.

The two elements 403, 404 with half wavelength cables are first tuned and matched to 50Ω independently. Then coil 404 is driven by a network analyzer while coil 403 is terminated with a short connecter. The current induced in coil 403 is sensed through the S21 measurement of its sensing coil 438, and the matching inductor 318 is adjusted until the induced current is lowest. To determine the value of L 312 to compensate for the output capacitance of high power MOSFET 311, each element coil 403, 404 is driven by its corresponding amplifier. Both amplifiers 401, 402 are simultaneously gated on with 3 ms pulses and 1% duty circle, and power amplifier 402 is excited by the network analyzer to output 1 W power. Then the L 312 of power amplifier 401 is tuned to make the induced current in coil 403 lowest. Similar strategies are applied to tune coil 404 and power amplifier 402.

While only certain features of the invention have been illustrated and described herein, the embodiments described are exemplary and non-limiting as many modifications and changes will occur to those skilled in the art. It is, therefore, to be understood that the appended claims are intended to cover all such modifications and changes as fall within the true spirit of the invention.

The invention claimed is:

1. A Radio Frequency (RF) power amplifier for driving a multiple transmit coil Magnetic Resonance Imaging (MRI) system, the RF power amplifier comprising:
    an output matching network with a high power MOSFET operatively coupled to at least one transmit coil in the MRI system for a desired output power and impedance, wherein the output matching network is coupled to a MOSFET for driving power, and wherein the output matching network comprises:
    an inductive component and a resonant network applied to the output of the MOSFET to transform a drain source impedance of the MOSFET into a low value output impedance ($Z_{OUT}$); and
    transform a load impedance ($Z_L$) into an optimum load value of the MOSFET for desired output power.

2. The amplifier of claim 1, wherein the resonant network comprises of capacitive and inductive components to transform drain-source resistive component of the MOSFET into an output impedance ($Z_{OUT}$) according to $$Z_{OUT} = \frac{1}{\omega^2 C^2 R_{DS}},$$

wherein ω is the Larmor frequency, C is the network capacitance, and $R_{DS}$ is the drain-source resistance.

3. The amplifier of claim 1, wherein
the output matching network further transforms a 50 ohm coil input impedance to a load impedance according to $$Z_L = \frac{1}{50\omega^2 C^2 - \frac{j}{\omega L_1}};$$

wherein $Z_L$ is the load impedance, ω is the Larmor frequency, C is the network capacitance, and $L_1$ is the network inductance, and
the network capacitance C and inductance $L_1$ are selected to transform the load impedance to an optimum load for the MOSFET according to $$Z_{OL} = \frac{1}{\frac{1}{R_{OL}} - j\omega C_{OSS}};$$

wherein $Z_{OL}$ is an optimum load impedance, ω is a Larmor frequency, $C_{OSS}$ is the drain-source capacitance, and $R_{OL}$ is the optimum load resistance.

4. The amplifier of claim 1, further comprising an input matching network operatively coupled to the coil on one end and to the output matching network on the other end.

5. The amplifier of claim 4, wherein the input matching network and the output matching network are coupled by a coaxial cable having a length corresponding to a half wavelength (λ/2) of a working frequency.

6. An ultra-low output impedance Radio Frequency (RF) power amplifier for transmit coil decoupling in parallel transmit, comprising: an output matching network and a high power MOSFET operatively coupled to the input of the output matching network to provide a desired output impedance ($Z_{OUT}$) of less than about 10 ohms for the transmit coil decoupling and to maximize available output power, wherein the output matching network is comprised of a first inductor in parallel to an output of the MOSFET, and a resonant network having a T-shaped section of one or more capacitors and at least one inductive element.

7. The ultra-low output impedance RF power amplifier for parallel transmit of claim 6, wherein the output matching network further comprising an input matching network operatively coupled to a coil on one end and to the output matching network on the other end with a half wavelength coaxial cable coupling to the output matching network.

8. The ultra-low output impedance RF amplifier for parallel transmit of claim 7, wherein the resonant network transforms drain-source resistive component of the MOSFET into an output impedance ($Z_{OUT}$) according to $$Z_{OUT} = \frac{1}{\omega^2 C^2 R_{DS}},$$

wherein $\omega$ is a Larmor frequency, C is a resonant network capacitance, and $R_{DS}$ is a drain-source resistance.

9. The ultra-low output impedance RF power amplifier for parallel transmit of claim 7, wherein the output matching network further transforms a 50 ohm coil input impedance to a load impedance according to $$Z_L = \frac{1}{50\omega^2 C^2 - \frac{j}{\omega L_1}};$$

wherein $Z_L$ is the load impedance, $\omega$ is the Larmor frequency, C is the network capacitance, and $L_1$ is the network inductance, and the network capacitance C and inductance $L_1$ are selected to transform the load impedance to an optimum load for the MOSFET according to $$Z_{OL} = \frac{1}{\frac{1}{R_{OL}} - j\omega C_{OSS}};$$

wherein $Z_{OL}$ is an optimum load impedance, $\omega$ is a Larmor frequency, $C_{OSS}$ is the drain-source capacitance, and $R_{OL}$ is the optimum load resistance.

10. A method for achieving decoupling using radio-frequency (RF) power amplifier to drive at least one transmit coil, comprising:

transforming a drain-source resistive component of a MOSFET to a desired output impedance using an output matching network;

transforming an input impedance of at least one transmit coil to a load impedance; and matching of the load impedance to an optimum load of the MOSFET for a maximum output power.

11. The method for achieving decoupling using RF power amplifier to drive at least one transmit coil of claim 10, wherein resonance of capacitive and inductive components of a resonant network transforms the drain source resistive component of the MOSFET to output impedance ($Z_{OUT}$), $$Z_{OUT} = \frac{1}{\omega^2 C^2 R_{DS}},$$

wherein $\omega$ is a Larmor frequency, C is a resonant network capacitance, and $R_{DS}$ is a drain-source resistance.

12. The method for achieving decoupling using RF power amplifier to drive at least one transmit coil of claim 10, wherein transforming the 50 ohm input impedance of the coil into the load impedance seen by the MOSFET according to $$Z_L = \frac{1}{50\omega^2 C^2 - \frac{j}{\omega L_1}}$$

by the output matching network; and the load impedance is matched to an optimum load for the MOSFET according to $$Z_{OL} = \frac{1}{\frac{1}{R_{OL}} - j\omega C_{OSS}}$$

by selecting the appropriate C and $L_1$.

13. The method for achieving decoupling using radio-frequency (RF) power amplifier to drive at least one transmit coil of claim 10, further comprising forming a phased array comprising more than one RF amplifier coupled to a respective coil driver.

* * * * *

UNITED STATES PATENT AND TRADEMARK OFFICE
CERTIFICATE OF CORRECTION

PATENT NO.      : 7,616,000 B2                                                Page 1 of 1
APPLICATION NO. : 11/940490
DATED           : November 10, 2009
INVENTOR(S)     : Chu et al.

It is certified that error appears in the above-identified patent and that said Letters Patent is hereby corrected as shown below:

In Column 5, Lines 25-27, in Eq. "[5]", delete " $Z_{OL} = \dfrac{1}{\dfrac{1}{R_{OL}} - j\omega C_{OSS}}$ " and insert -- $Z_L = Z_{OL} = \dfrac{1}{\dfrac{1}{R_{OL}} - j\omega C_{OSS}}$ --, therefor.

In Column 6, Lines 29-32, in Claim 3, delete " $Z_{OL} = \dfrac{1}{\dfrac{1}{R_{OL}} - j\omega C_{OSS}}$ " and insert -- $Z_L = Z_{OL} = \dfrac{1}{\dfrac{1}{R_{OL}} - j\omega C_{OSS}}$ --, therefor.

In Column 7, Lines 27-30, in Claim 9, delete " $Z_{OL} = \dfrac{1}{\dfrac{1}{R_{OL}} - j\omega C_{OSS}}$ " and insert -- $Z_L = Z_{OL} = \dfrac{1}{\dfrac{1}{R_{OL}} - j\omega C_{OSS}}$ --, therefor.

In Column 8, Lines 31-34, in Claim 12, delete " $Z_{OL} = \dfrac{1}{\dfrac{1}{R_{OL}} - j\omega C_{OSS}}$ " and insert -- $Z_L = Z_{OL} = \dfrac{1}{\dfrac{1}{R_{OL}} - j\omega C_{OSS}}$ --, therefor.

Signed and Sealed this

Tenth Day of August, 2010

David J. Kappos
*Director of the United States Patent and Trademark Office*